US011379300B2

(12) United States Patent
Lee et al.

(10) Patent No.: US 11,379,300 B2
(45) Date of Patent: Jul. 5, 2022

(54) STORAGE DEVICE AND METHOD FOR OPERATING STORAGE DEVICE

(71) Applicant: Samsung Electronics Co., Ltd., Suwon-si (KR)

(72) Inventors: Jong Won Lee, Seoul (KR); Kil Hwan Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 125 days.

(21) Appl. No.: 16/548,332

(22) Filed: Aug. 22, 2019

(65) Prior Publication Data

US 2020/0293401 A1    Sep. 17, 2020

(30) Foreign Application Priority Data

Mar. 11, 2019  (KR) .................. 10-2019-0027578

(51) Int. Cl.
*G06F 11/10* (2006.01)
*G06F 3/06* (2006.01)
*G11C 29/52* (2006.01)

(52) U.S. Cl.
CPC ........ *G06F 11/1068* (2013.01); *G06F 3/0604* (2013.01); *G06F 3/0647* (2013.01); *G06F 3/0659* (2013.01); *G06F 3/0679* (2013.01); *G11C 29/52* (2013.01)

(58) Field of Classification Search
CPC .. G06F 11/1068; G06F 3/0604; G06F 3/0647; G06F 3/0659; G06F 3/0679; G06F 11/1048; G06F 3/0619; G06F 3/0656; G06F 3/0689; G06F 11/1076; G11C 29/52

USPC ......................................................... 714/800
See application file for complete search history.

(56) References Cited

U.S. PATENT DOCUMENTS

| | | | | |
|---|---|---|---|---|
| 8,819,338 | B2 * | 8/2014 | Uehara | ................. G06F 3/0688 |
| | | | | 711/114 |
| 8,862,804 | B2 | 10/2014 | Horn | |
| 9,405,617 | B1 | 8/2016 | Syu | |
| 9,734,009 | B2 * | 8/2017 | Hu | .................... H03M 13/2906 |
| 10,132,870 | B2 | 11/2018 | Wang et al. | |
| 2015/0293714 | A1 * | 10/2015 | Matsubara | ............ G06F 13/124 |
| | | | | 711/162 |
| 2017/0010812 | A1 * | 1/2017 | Yoshida | .............. G06F 12/0811 |
| 2017/0310341 | A1 * | 10/2017 | Yuan | .................. H03M 13/1102 |
| 2018/0101441 | A1 | 4/2018 | Hyun et al. | |
| 2018/0129451 | A1 | 5/2018 | Park et al. | |

(Continued)

OTHER PUBLICATIONS

Extended European Search Report dated Jul. 27, 2020 issued in corresponding European Appln. No. 20160774.4.

*Primary Examiner* — James C Kerveros
(74) *Attorney, Agent, or Firm* — Harness, Dickey & Pierce, P.L.C.

(57) ABSTRACT

A storage device and a method for operating the storage device are provided. A storage device includes processing circuitry configured to write multi-stream data on a non-volatile memory; generate parity data of the multi-stream data and/or intermediate parity data upon which the parity data is based; store the parity data and/or the intermediate parity data in a first memory; and perform a data swap between the first memory and a second memory, wherein a number of slots of a plurality of slots in the first memory is based on a number of execution units of program buffering of the non-volatile memory.

16 Claims, 14 Drawing Sheets

(56) References Cited

U.S. PATENT DOCUMENTS

2018/0203765 A1* 7/2018 Critchley .............. G06F 3/0689
2019/0310780 A1* 10/2019 Gholamipour ...... G06F 12/0246
2020/0174690 A1* 6/2020 Byun ...................... G06F 3/064

* cited by examiner

STORAGE DEVICE AND METHOD FOR OPERATING STORAGE DEVICE

CROSS-REFERENCE TO RELATED APPLICATION

This application claims priority to Korean Patent Application No. 10-2019-0027578 filed on Mar. 11, 2019 in the Korean Intellectual Property Office, and all the benefits accruing therefrom under 35 U.S.C. § 119, the contents of which in its entirety are herein incorporated by reference.

BACKGROUND

1. Field of the Disclosure

The present disclosure relates to storage devices and methods for operating storage devices.

2. Description of the Related Art

A storage device may receive write/read commands from a host, write data provided from the host on a non-volatile memory, and/or provide data read from non-volatile memory to the host.

In order to stably store data in the non-volatile memory and to promote reliability, parity data may be calculated and used. Specifically, parity data may be generated from data stored in non-volatile data, and if some data stored in non-volatile data is damaged, corrupted data may be repaired using the parity data. A RAID (Redundant Array of Independent Disks) architecture may be adopted as an example of such a technique, and such a technique may be utilized for a single storage device.

However, when data storage that uses such parity data is utilized in a storage device that supports multi-stream data, since the types of parity data to be generated increases, a plan for promoting efficient use of limited resource of the storage device may be desirable.

SUMMARY

Some example embodiments of the present disclosure include storage devices and methods for operating the same. Some example embodiments may be capable of improving the performance and efficiency of processing parity data in storage devices that support multi-stream data to which data storage using the parity data is applied.

According to some example embodiments of the present disclosure, a storage device may include processing circuitry configured to write multi-stream data on a non-volatile memory; generate parity data of the multi-stream data or intermediate parity data used for generating the parity data; store the parity data and/or the intermediate parity data in a first memory; and perform a data swap between the first memory and a second memory, wherein the first memory includes a plurality of slots, and the number of slots is based on a number of execution units of program buffering of the non-volatile memory.

According to some example embodiments of the present disclosure, a storage device may include a non-volatile memory; a controller which writes multi-stream data on the non-volatile memory; a processor which generates parity data of the multi-stream data or intermediate parity data used for generating the parity data; a first memory which stores the parity data and/or the intermediate parity data; and a second memory which performs data swap with the first memory, wherein the processor determines whether to execute the data swap based on a number of the parity data and/or the intermediate parity data stored in the first memory and a value based on a number of execution units of the program buffering of the non-volatile memory.

According to some example embodiments of the present disclosure, a method for operating a storage device may include receiving a first data stream of multi-stream data; generating parity data of the first data stream and/or intermediate parity data of the first data stream upon which the parity data is based; determining whether there is an empty slot in a first memory; storing the parity data and/or the intermediate parity data in the empty slot, based on the empty slot being in the first memory; transferring data stored in one slot of the plurality of slots to a second memory, and, and storing the parity data and/or the intermediate parity data in the one slot of the first memory, wherein a number of slots of the first memory is based on a number of execution units of the program buffering of the non-volatile memory.

However, some example embodiments of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

Some example embodiments of the present disclosure will become more apparent by describing in detail example embodiments thereof with reference to the attached drawings, in which.

DETAILED DESCRIPTION

Hereinafter, various embodiments of the present disclosure will be described with reference to the attached drawings.

Figure 1A:
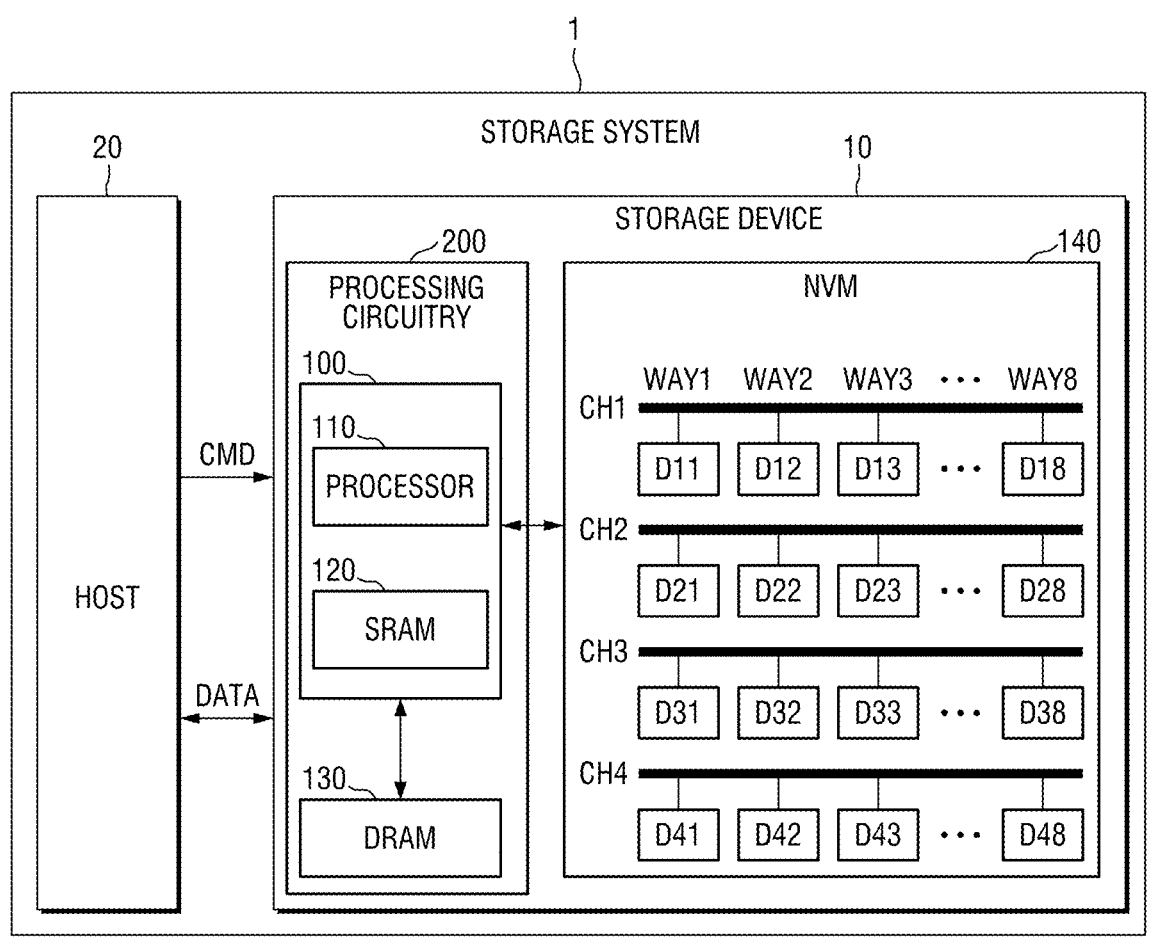
FIGS. 1A and 1B are block diagrams illustrating a storage system according to some example embodiments of the present disclosure.
Figure 1B:
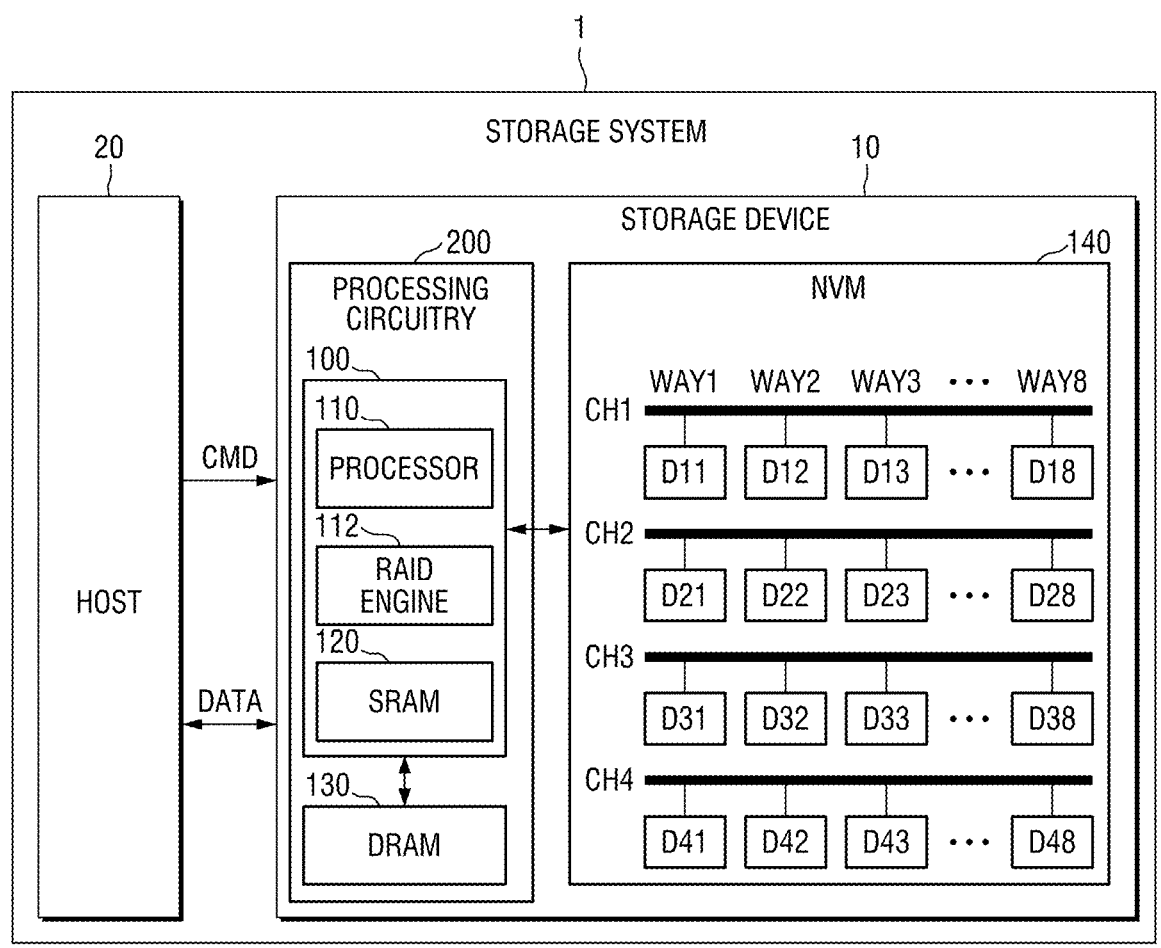

FIGS. 1A and 1B are block diagrams illustrating a storage system according to some example embodiments of the present disclosure.

Referring to FIG. 1A, a storage system 1 according to some example embodiments of the present disclosure includes a storage device 10 and a host 20.

The storage device 10 may be configured to provide storage service to the host 20 in response to a command CMD received from the host 20.

For example, the storage device 10 may be configured to receive a write command CMD from the host 20 and to write data DATA provided from the host 20 on a non-volatile memory 140 in response thereto. Further, the storage device 10 may be configured to receive a read command CMD from the host 20 and to provide data DATA read from the non-volatile memory 140 to the host in response thereto.

In some example embodiments of the present disclosure, the host 20 may include processing circuitry. As an example, the host 1100 may include a general purpose processor, a special purpose processor, and/or an application processor (AP). However, some other example embodiments within the scope of the present disclosure may not be limited thereto. For example, additionally or alternatively, the host 20 may be a processor itself or an electronic device or system that includes at least one processor.

In some example embodiments of the present disclosure, the storage device 10 and the host 20 may be connected via an electrical interface such as a universal flash storage (UFS), a small computer system interface (SCSI), a serial advanced technology attachment (SATA), and/or an embedded multimedia card (eMMC). However, some other example embodiments within the scope of the present disclosure may not be limited thereto, and some other example embodiments may be differently organized.

In some example embodiments such as shown in FIG. 1A, the storage device 10 may include processing circuitry 200, which, in the example embodiment of FIG. 1, includes a controller 100 including a processor 110 and a first memory 120, a second memory 130, and a non-volatile memory 140.

The controller 100 may be configured to control an operation of the storage device 10. For example, the controller 100 may be configured to read, wrote, and/or erase data requested by the host 20 for the non-volatile memory 140. In some example embodiments, the controller 100 may be configured to write multi-stream data on the non-volatile memory 140 or may read multi-stream data from the non-volatile memory 140.

In some example embodiments of the present disclosure, the controller 100, as part of the processing circuitry 200, may include hardware, software, or a hybrid of hardware and software. For example, the controller 100 may include a dedicated hardware circuit that is configured to perform particular operations. Additionally or alternatively, the controller 100 may include one or more processor cores that are configured to execute an instruction set of program code for performing an operation.

In some example embodiments, the control operation on the storage device 10 performed by the controller 100 may be performed by a processor 110. In some example embodiments of the present disclosure, the processor 110, as part of the processing circuitry, may be implemented in the form of hardware, software or a hybrid of hardware and software. For example, the processor 110 may include a central processing unit (CPU) or a dedicated hardware circuit that are configured to perform operations. Additionally or alternatively, the processor 110 may include one or more processor cores that are configured to execute an instruction set of program code for performing operations.

In some example embodiments such as shown in FIG. 1A, the processor 110 may be configured to perform a control so that data is stored in the non-volatile memory 140 based on the parity data. For example, the processor 110, as part of the processing circuitry 200, may be configured to generate parity data for the multi-stream data, and/or to generate intermediate parity data upon which the parity data may be based. In some example embodiments, the processor 110, as part of the processing circuitry 200, may be configured to store the generated parity data together with the data in the non-volatile memory 140, and/or to use the parity data, for example, to recover the data during a repair operation.

In some example embodiments, the first memory 120, as part of the processing circuitry 200, may be configured to store data utilized for operation of the controller 100. In some example embodiments of the present disclosure, the first memory 120 may be implemented as a static random access memory (SRAM). However, some other example embodiments within the scope of the present disclosure may not be limited thereto. In some example embodiments, the first memory 120 may include one or more of various volatile/non-volatile memories. In some example embodiments, the first memory 120 may be configured to store data (e.g., parity data and/or intermediate parity data) utilized for operation of the processor 110.

In some example embodiments, the second memory 130, as part of the processing circuitry 200, may include and/or be configured to act as a buffer memory for buffering the data used for the operation of the storage device 10. In some example embodiments of the present disclosure, the second memory 130 may be implemented as a dynamic random access memory (DRAM). However, some other example embodiments within the scope of the present disclosure may not be limited thereto. For example, in some other example embodiments, the second memory 130 may include one or more of various volatile/non-volatile memories. In some example embodiments, the second memory 130 may be configured to perform a data swap with the first memory 120 and/or to store data (e.g., parity data and/or intermediate parity data) used for operation of the processor 110.

In some example embodiments of the disclosure, the second memory 130 may have more capacity than the first memory 120. However, the scope of the disclosure is not limited thereto. For example, in some other example embodiments, the first memory 120 and the second memory 130 may have equal capacity, or the first memory 120 may have more capacity than the second memory 130.

In some example embodiments, the non-volatile memory 140 may include a flash memory, a magnetoresistive random access memory (MRAM), a phase-change random access memory (PRAM), a ferroelectric random access memory (FeRAM) and/or the like. However, some other example embodiments within the scope of the present disclosure may not be limited thereto. For example, in some example embodiments, the non-volatile memory 140 may include a flash memory, and/or the non-volatile memory 140 may include a memory cell array formed along a plurality of word lines and/or a plurality of bit lines. In some example embodiments of the present disclosure, some or all of the non-volatile memory 140 may be replaced with a volatile memory such as SRAM, DRAM, and/or SDRAM (Synchronous DRAM).

In some example embodiments of the present disclosure, the storage system 1 may be implemented as a single electronic device. For example, the storage system 1 may correspond to one of various electronic devices such as home appliances, desktop computers, laptop computers, tablet computers, smartphones, wearable devices, portable and non-portable media devices, video game machines including the host 20 and the storage device 10. In some example embodiments of the present disclosure, the storage system 1 may be implemented as a plurality of electronic devices. For example, in some example embodiments, the host 20 and the storage device 10 may correspond to separate electronic devices from one another, and/or may be connected locally and/or remotely to implement the storage system 1.

The example of FIG. 1A includes a storage system 1 in which the processing circuitry 200 includes a controller 100, a processor 110, a first memory 120, and a second memory 130, and a non-volatile memory 140. However, it is to be appreciated that other example embodiments may include a different organization of processing circuitry 200, such as more or fewer components; a different set of relationships and interconnections; and/or a different arrangement of functionality among the components. In some example embodiments, a first component may include a second component, while in other example embodiments, the first component and the second component may be discrete and separate. In some example embodiments, functionality may be implemented by a single component, while in other example embodiments, the same functionality may be distributed over two or more components. In various example embodiments, two or more components may operate synchronously and/or asynchronously. In various example embodiments, two or more components may operate consecutively and/or concurrently.

In some example embodiments, the processing circuitry 200 may include hardware such as logic circuits; a hardware/software combination, such as a processor executing software; or a combination thereof. For example, a processor may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

In the example embodiment of FIG. 1A, a plurality of channels and a plurality of ways are defined in the non-volatile memory 140, wherein the plurality of channels includes channels CH1 to CH4, and the plurality of ways includes ways WAY1 to WAY8. A die D11 made up of memory cells is disposed at a position at which the channel CH1 and the way WAY1 intersect, and a die D23 is provided at a position at which the channel CH2 and the way WAY3 intersect. Thus, in the non-volatile memory 140 of FIG. 1A, a total of four channels and eight ways are defined, and a total of 32 dies are disposed between them. Thirty-one dies among the thirty-two dies are designated as a space for storing the data, and remaining one die (e.g., die D48) is designated as a space for storing the parity data. The number of channels, ways and dies illustrated in FIG. 1A is merely an example, and in some other example embodiments may be variously changed as desired.

Referring to FIG. 1B, the storage system 1 according to an example embodiment of the present disclosure may be configured to support a RAID manner.

In the example embodiment of FIG. 1B, the processor 110 may perform a control so that data is stored in the non-volatile memory 140 in a RAID manner. For example, the processor 110 may be configured to generate parity data of multi-stream data and/or intermediate parity data used for generating the parity data so as to implement RAID.

In some example embodiments, the controller 100 may further include a RAID engine 112 that is configured to perform an operation for supporting the RAID manner. Such a RAID engine 112, as part of the processing circuitry 200, may include hardware, software, or a hybrid of hardware and software. In some example embodiments, the RAID engine 112 may include a dedicated hardware circuit that is configured to perform operations. Additionally or alternatively, the RAID engine 112 may include one or more processor cores configured to execute an instruction set of program code for performing operations. However, the RAID architecture in FIG. 1B only corresponds to some example embodiments of the data storage technique using the parity data of the present disclosure. In some example embodiments, the storage device and the method for operating the storage device are not limited to RAID architectures. Some other example embodiments to be described below may also be applicable to RAID architectures as an example.

Figure 2:
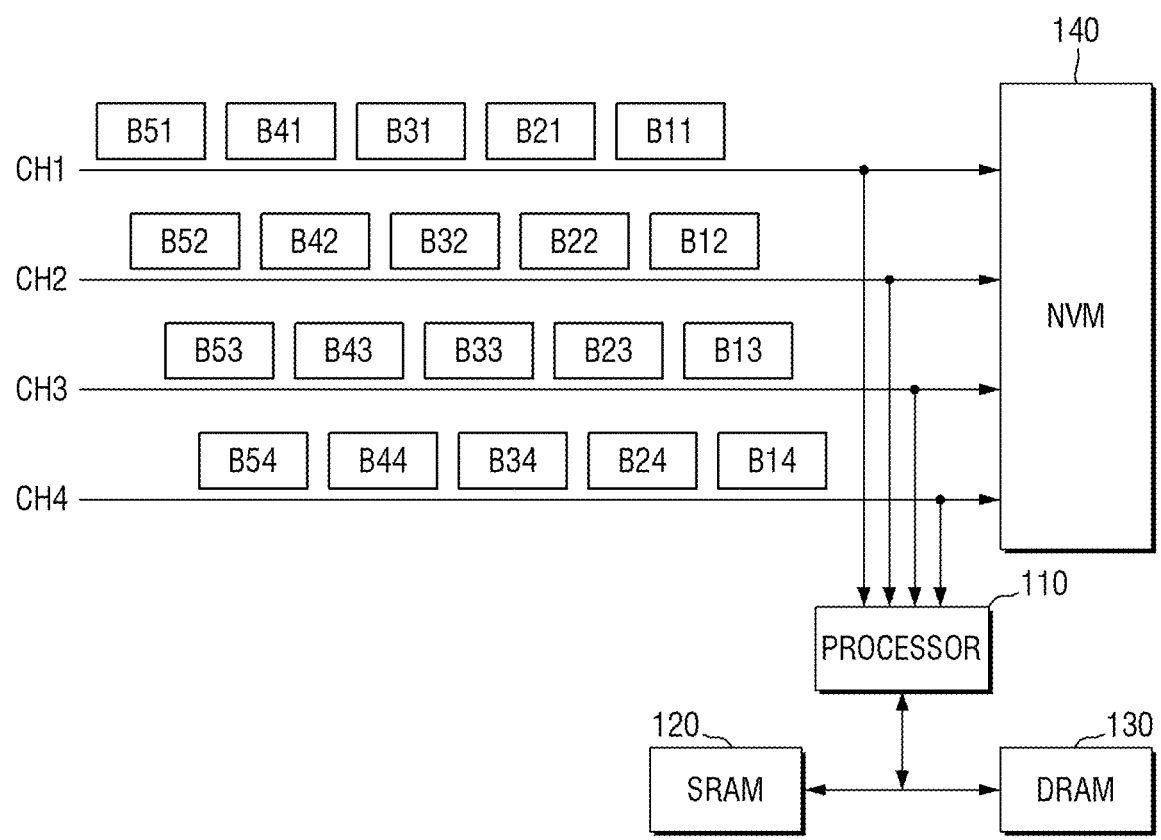
FIG. 2 is a block diagram illustrating a storage device according to some example embodiments of the present disclosure.

FIG. 2 is a block diagram illustrating a storage device according to some example embodiments of the present disclosure.

Referring to FIG. 2, the storage device 10 according to some example embodiments of the present disclosure may be configured to receive multi-stream data through a plurality of channels CH1 to CH4. Further, the storage device 10 may be configured to store the received multi-stream data in the non-volatile memory 140.

FIG. 2 illustrates five data streams as an example. Each data stream is received by the storage device 10 through the plurality of channels CH1 to CH4. The first data stream may include data chunks B11 to B14, and the second data stream may include data chunks B21 to B24. Similarly, the third to fifth data streams may include data chunks B31 to B34, data chunks B41 to B44 and data chunks B51 to B54, respectively.

The processing circuitry 200, such as a processor 110, may be configured to perform snooping on the data streams to be transmitted to the non-volatile memory 140 from the input of the storage device 10 through the plurality of channels CH1 to CH4. The processing circuitry 200, such as a processor 110, may be configured to generate parity data for each data stream and/or to generate intermediate parity data upon which the parity data may be based.

In some example embodiments, parity data and/or intermediate parity data generated by the processing circuitry 200, such as a processor 110, may be stored in the first memory 120. Further, when the number of parity data or intermediate parity data stored in the first memory 120 exceeds a preset value, some example embodiments may be configured to perform a data swap between the first memory 120 and the second memory 130, for example, to make an empty space in the first memory 120.

In some example embodiments, such as that shown in FIG. 2, the storing of the parity data and/or intermediate data upon which the parity data is based may be performed efficiently over a set of streams, including memory management between a first memory 120 (such as SRAM) and a second memory 130 (such as DRAM). The efficiency of managing memory in the storage of such data may, for example, promote consistency in the efficiency of storage of the parity data and/or intermediate parity data for the streams, which may reduce latency and/or intermittent variance in memory access while processing multiple streams of data. Such processing may, for example, reduce the incidence of delays in storing the parity data, which may otherwise affect operations of the processing circuitry in receiving and storing the data, such as buffer overflow and/or underflow, processor capacity shortages, bus usage, etc., each of which may affect the performance and/or quality of the multi-stream data and/or a storage device processing multi-stream data. In some example embodiments, such efficiency may be desirable, reducing the computation and/or variance resulting from memory access in the processing and storage of parity data and/or intermediate parity data may enable the processing circuitry to devote more resources to processing the multiple streams of data.

Figure 3:
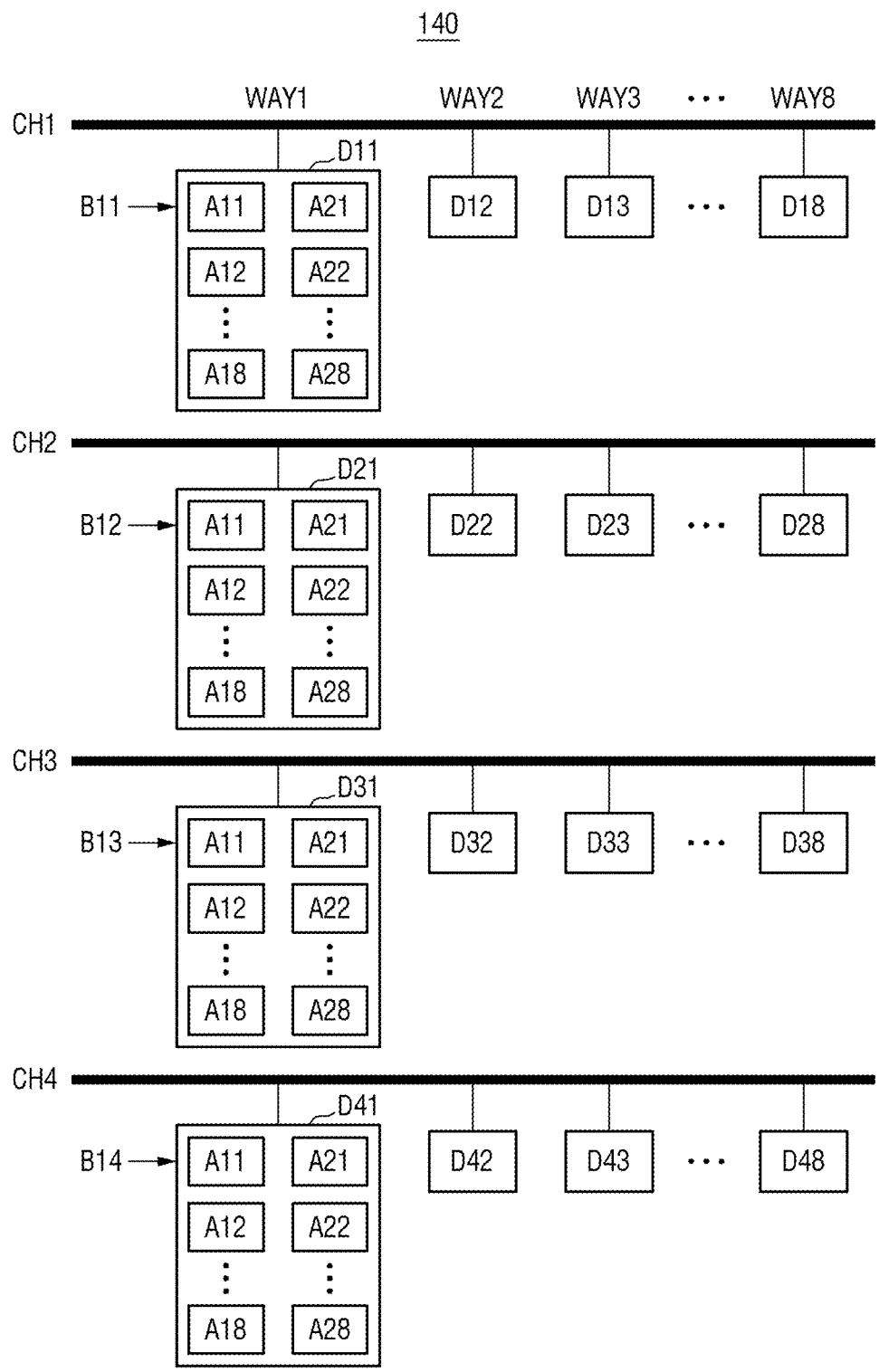
FIGS. 3 and 4 are block diagrams illustrating a non-volatile memory of a storage device according to some example embodiments of the present disclosure.
Figure 4:
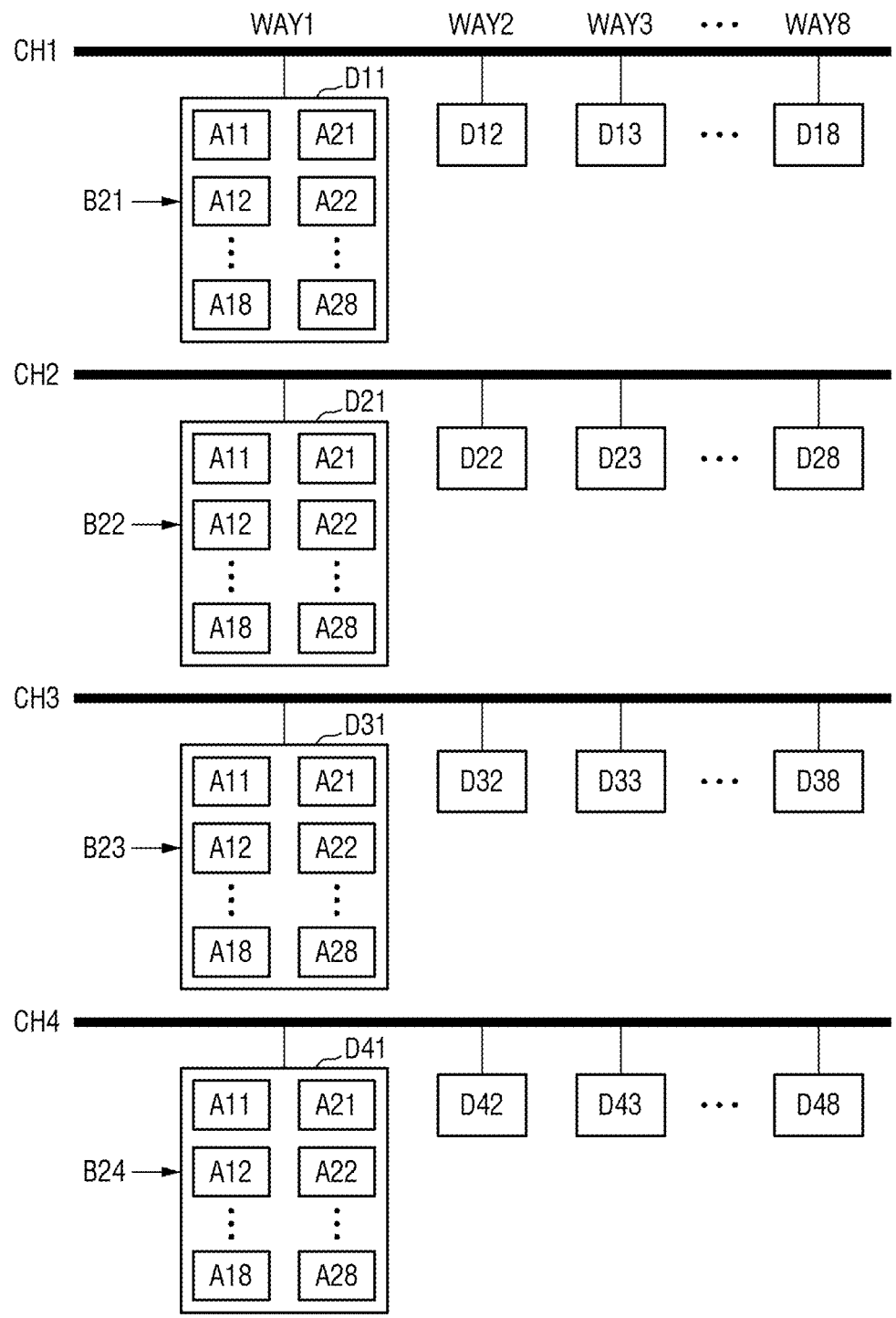

FIGS. 3 and 4 are block diagrams illustrating the non-volatile memory of the storage device according to some example embodiments of the present disclosure.

First, referring to FIG. 3, a plurality of channels CH1 to CH4 and a plurality of ways WAY1 to WAY8 are defined in the non-volatile memory 140 of the storage device 10 according to some example embodiments of the present disclosure, and a plurality of dies D11 to D48 is disposed between them.

In FIG. 3, the internal structures of a plurality of dies D11, D21, D31 and D41 corresponding to the way WAY1 are illustrated, and the contents of such internal structures may be equally applied to other remaining dies.

The die D11 will be described. The die D11 may have, for example, two planes, and each plane may include a plurality of blocks. Specifically, the die D11 may have a first plane including the blocks A11 to A18 and a second plane including the blocks A21 to A28. Further, the dies D21 to D41 may also have a first plane including the blocks A11 to A18 and a second plane including the blocks A21 to A28.

Referring to FIG. 2 and FIG. 3 together, the data chunk B11 of the first data stream may be stored in the blocks A11 and A21 of the die D11. Furthermore, the data chunk B11 may be stored in the blocks A11 and A21 of at least one of the dies D11 to D18. Similarly, the data chunks B12 of the first data stream may be stored in the blocks A11 and A21 of the die D21. Furthermore, data chunks B12 may be stored in the blocks A11 and A21 of at least one of the dies D21 to D28. Data chunks B13 and B14 of the first data stream may also be stored in a similar manner. Next, referring to FIG. 2 and FIG. 4 together, data chunk B21 of the second data stream may be stored in the blocks A12 and A22 of the die D11. Furthermore, data chunk B21 may be stored in the blocks A12 and A22 of at least one of the dies D11 to D18. Similarly, data chunk B22 of the second data stream may be stored in the blocks A12 and A22 of the die D21. Furthermore, data chunk B22 may be stored in the blocks A12 and A22 of at least one of the dies D21 to D28. Data chunks B23 and B24 of the second data stream may also be stored in a similar manner. In this way, the controller 100 may write multi-stream data including the first data stream to the fifth data stream on the non-volatile memory 140.

In some example embodiments, at least one die (e.g., die D48) of the plurality of dies D11 to D48 may be designated to store the parity data of each of the multi-stream data. The parity data may be used to repair corrupted data during a repair operation.

Referring to FIG. 2 again, a processor 110 may be configured to generate parity data for each of the multi-stream data. That is, the a processor 110, may be configured to generate first parity data of the first data stream, generate second parity data of the second data stream, and/or generate the third to fifth parity data of each of the third to fifth data streams.

In some example embodiments, the processor 110, may be configured to first store the data chunk B14 in the first memory 120 and then generate the first parity data of the first data stream. Based on the data chunk B13 being detected, the processor 110, may be configured to perform a logical operation (e.g., an XOR operation) on the data chunk B14 and the data chunk B13 to generate the first intermediate parity data, and then store the first intermediate parity data in the first memory 120. The logical operation may be identified, desired, and/or predetermined. Next, based on the data chunk B12 being detected, the processor 110, may be configured to perform a logical operation on the first intermediate parity data and the data chunk B12 to generate the second intermediate parity data and store it in the first memory 120. Based on the data chunk B11 being detected, the processor 110, may be configured to perform a logical operation on the second intermediate parity data and the data chunk B11 to generate final parity data. The final parity data may be stored in the first memory 120 and/or on the die of the non-volatile memory 140, for example, the die D48. In this way, a plurality of intermediate parity data, upon which parity data of one data stream may be based, may be generated, stored in the first memory 120, and/or used for the next operation. However, the capacity of the first memory 120 may be limited. As described in connection with FIG. 1A, the first memory 120 may have a capacity smaller than that of the second memory 130 that may include, or may be configured to serve as, a buffer memory of the storage device 10. Thus, some example embodiments may overcome limitations of the first memory 120 having limited capacity by using a method for performing a data swap on the second memory 130, which may present a problem of how much capacity is allowed for the first memory 120.

Figure 5:
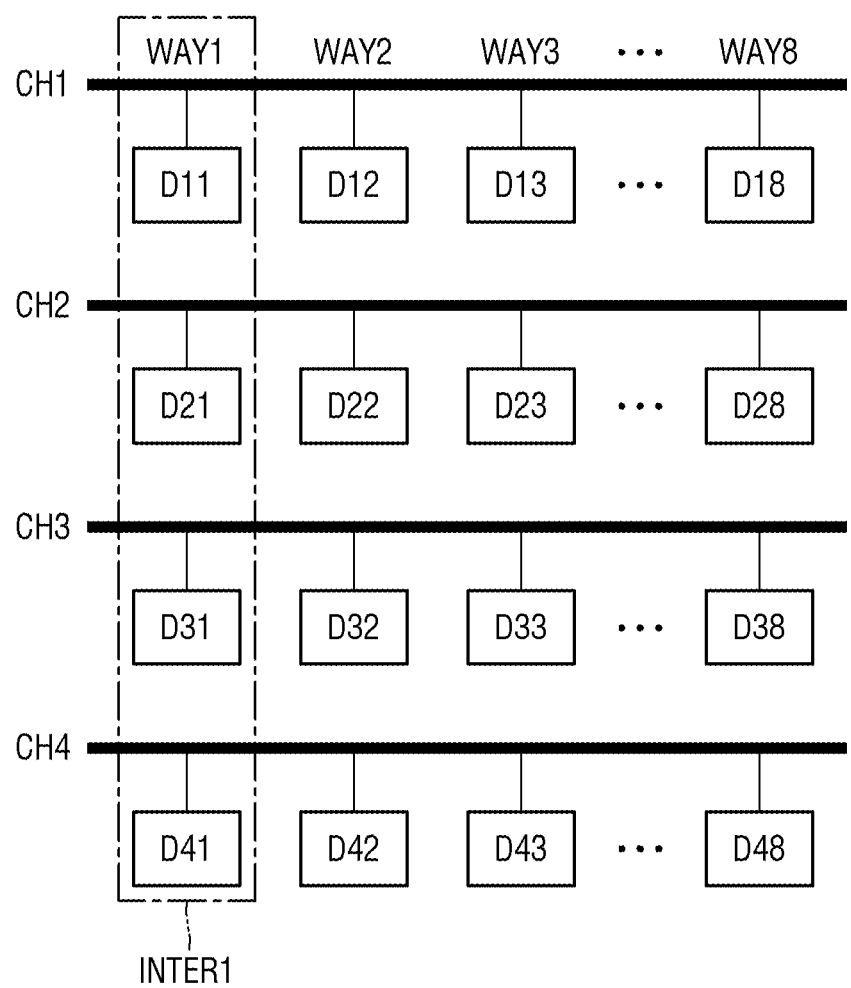
FIG. 5 is a block diagram illustrating a non-volatile memory of a storage device according to some example embodiments of the present disclosure.

FIG. 5 is a block diagram illustrating the non-volatile memory of the storage device according to some example embodiments of the present disclosure.

Referring to FIG. 5, an interleaving region INTER1 may represent an execution unit of program buffering of the non-volatile memory 140. For example, in the present embodiment, the interleaving region INTER1 may include four channels and one way.

First, in some example embodiments, a plurality of slots may be defined in the first memory 120 and configured to store the parity data and/or the intermediate parity data on the multi-stream data. In this case, the number of slots may be based on the number of execution unit of program buffering of the non-volatile memory 140. In some example embodiments, the number of execution units of program buffering here may be based on the number of channels and ways of the non-volatile memory 140.

That is, in some example embodiments such as shown in FIG. 5, the number of execution units for program buffering may be four corresponding to the number of dies D11, D21, D31 and D41 connected to four channels and one way, and thus, the first memory 120 may be set to include, for example, (4−1=3) three slots.

In some other example embodiments of the present disclosure, the number of slots of the first memory 120 may be proportional to the number of execution units of program buffering of the non-volatile memory 140. That is, in some example embodiments, even if the number of slots is not three, the number of slots may be based on a number that is proportional to the number of execution units of the program buffering.

In some example embodiments of the present disclosure, the number of slots of the first memory 120 may be smaller than a number of streams in the multi-stream data.

In some example embodiments, the first memory 120 may be controlled based on the operation of the processor 110. In this case, the processor 110, may be configured to determine whether to perform the data swap based on the number of parity data and/or intermediate parity data stored in the first memory 120 and/or the number of execution units of program buffering of the non-volatile memory 140.

In some example embodiments, the value may be based on the number of execution units for program buffering, which in this example is 4. The processor 110, may determine whether to perform the data swap based whether the number of parity data or intermediate parity data to be stored in the first memory 120 is less than 4 or equal to or greater than 4.

In some example embodiments of the present disclosure, the value may be proportional to the number of execution units of program buffering of the non-volatile memory 140. That is, in some example embodiments, even if the value is not necessarily equal to the number of execution units for program buffering (e.g., 4), the value may be a number that is proportional to the number of execution units of program buffering.

In some example embodiments of the present disclosure, the value may be smaller than the number of multi-stream data.

Figure 6:
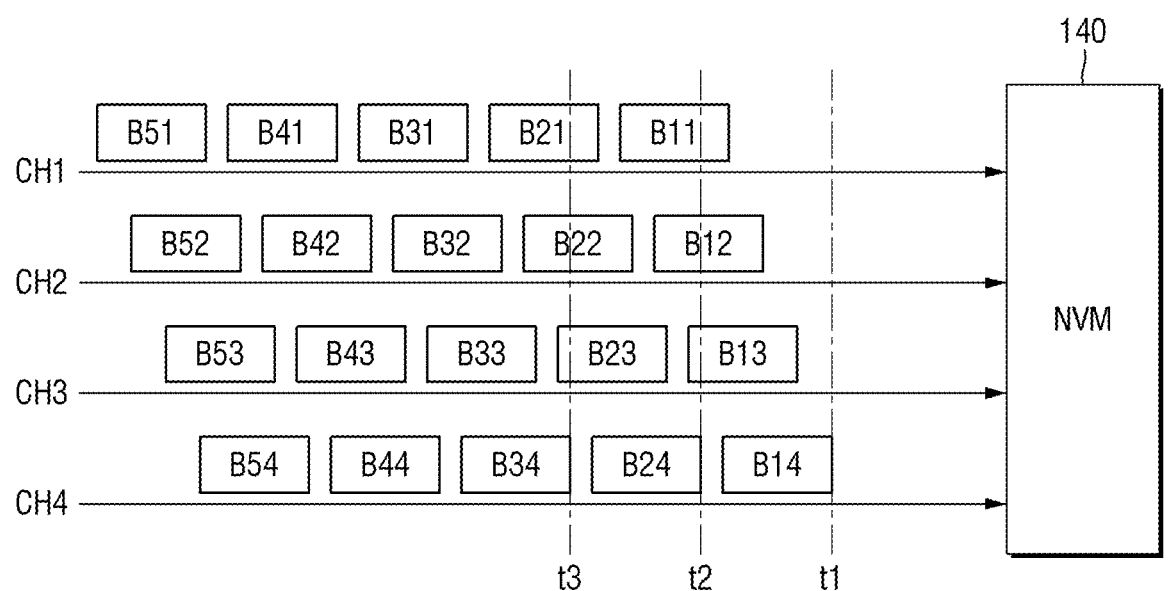
FIGS. 6 to 8 are block diagrams illustrating operation of a storage device according to some example embodiments of the present disclosure in relation to FIG. 5.
Figure 6:
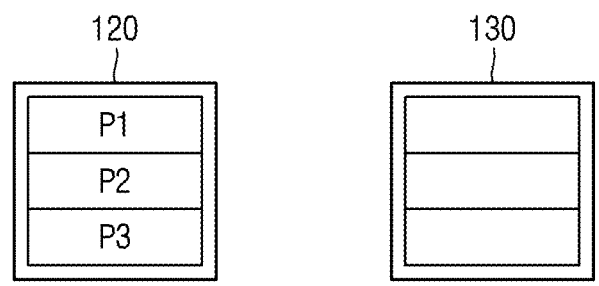
Figure 7:
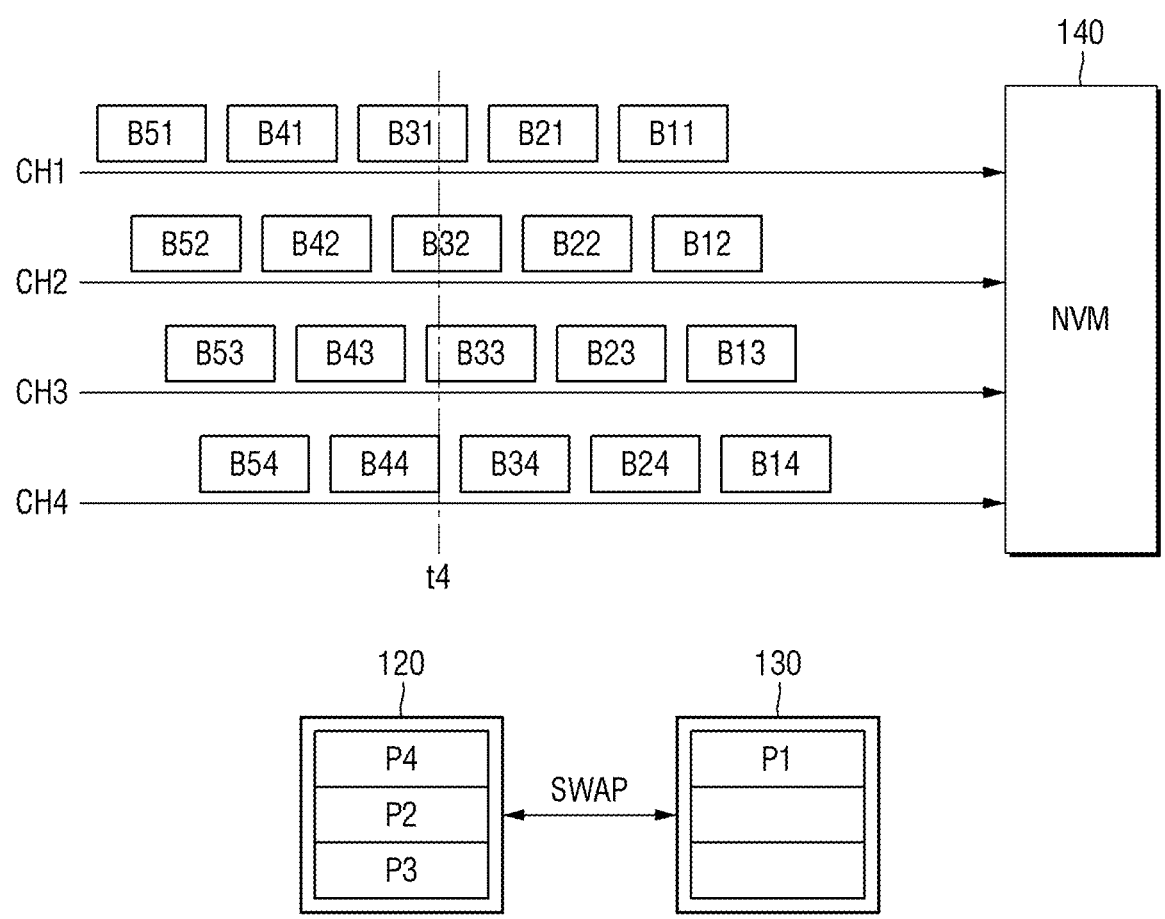
Figure 8:
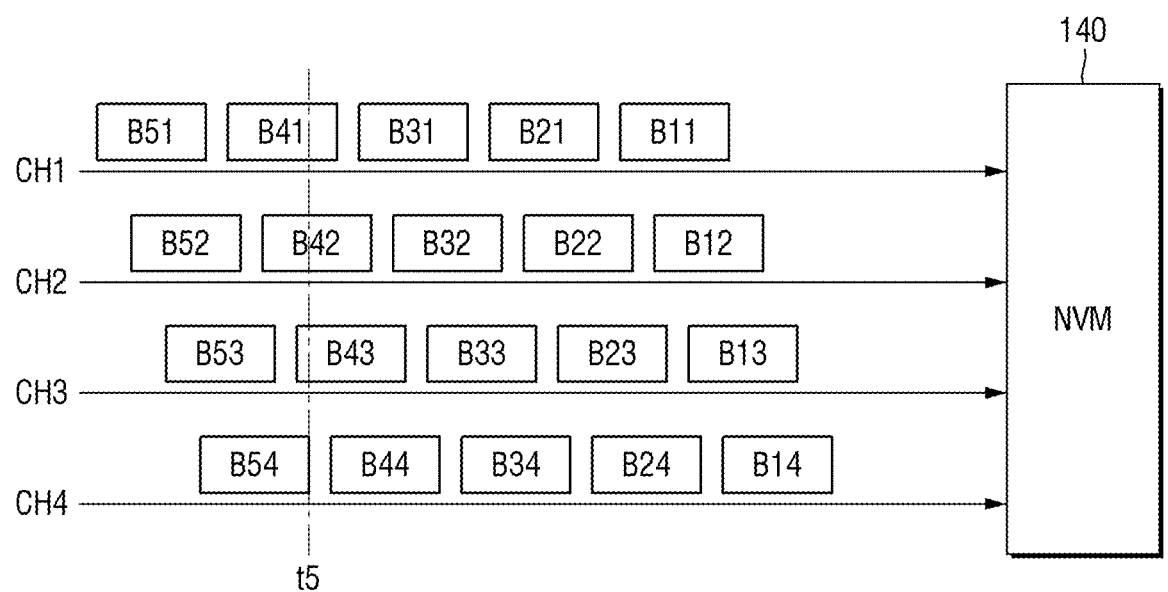
Figure 8:
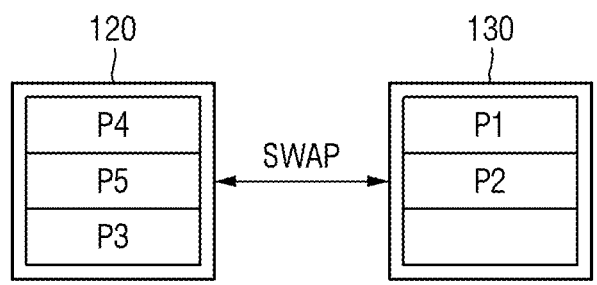

FIGS. 6 to 8 are block diagrams illustrating the operation of the storage device according to some example embodiments of the present disclosure in relation to FIG. 5.

First, referring to FIG. 6, based on an empty slot being in the plurality of slots in the first memory 120, the processor 110 may store the parity data and/or the intermediate parity data in the empty slot. The slots of the plurality of slots of the first memory 120 may be determined to be three according to the example of FIG. 5.

In the example of FIG. 6, at time t1, the processor 110 may be configured to store a data chunk B14 in the first memory 120. Further, the processor 110 may be configured to store the intermediate parity data in the first memory 120 according to the detection of the data chunks B13 and B12, and then the processor 110 may be configured to store the final parity data as "P1" in the first memory 120 according to the detection of the data chunk B11.

Next, at time t2, the processor 110 may be configured to store a data chunk B24 in one of the remaining empty slots of the first memory 120. Further, the processor 110 may be configured to store the intermediate parity data in the first memory 120 according to the detection of the data chunks B23 and B22, and then the processor 110 may be configured to store the final parity data as "P2" in the first memory 120 according to the detection of the data chunk B21.

Next, at time t3, the processor 110 may be configured to store a data chunk B34 in the remaining empty slot of the first memory 120. Further, the processor 110 may be configured to store the intermediate parity data in the first memory 120 according to the detection of the data chunks B33 and B32, and then, the processor 110 may be configured to store the final parity data as "P3" in the first memory 120 according to the detection of the data chunk B31.

Subsequently, referring to FIG. 7, based on no empty slot being in the plurality of slots of the first memory 120, the processor 110 may be configured to transfer data in one slot of the plurality of slots of the first memory 120 to the second memory 130, and to store the parity data and/or the intermediate parity data in the one slot.

Specifically, at time t4, the data chunk B44 is to be stored in the first memory 120, but no empty slot is in the plurality of slots in the first memory 120. In this case, the processor 110 may be configured to transfer the data "P1" stored in the one slot of the first memory 120 to the second memory 130, and to store the data chunk B44 in the one slot. Also, the processor 110 may be configured to store the intermediate parity data in the first memory 120 according to the detection of the data chunks B43 and B42, and then, the processor 110 may be configured to store the final parity data as "P4" in the first memory 120 according to the detection of the data chunk B41.

In some example embodiments, the processor 110 may be configured to select the one slot of the plurality of slots based on a LRU (Least Recently Used) policy in the first memory 120, but some other example embodiments within the scope of the present disclosure may not be limited thereto. For example, in some other example embodiments, the processor 110 may be configured to select the one slot of the plurality of slots based on a least-frequently-used (LFU) or adaptive replacement policy in the first memory 120.

Next, referring to FIG. 8, at time t5, the data chunk B54 is to be stored in the first memory 120, but there is no empty slot in the plurality of slots of the first memory 120. In this case, the processor 110 may be transfer to store the data "P2" stored in the one slot of the first memory 120 to the second memory 130, and to store the data chunk B54 in the one slot. Also, the processor 110 may be configured to store the intermediate parity data in the first memory 120 according to the detection of the data chunks B53 and B52, and then, the processor 110 may be configured to store the final parity data as "P5" in the first memory 120 according to the detection of the data chunk B51.

In some example embodiments, the operations of FIGS. 6 to 8 may be equally or similarly applied to the operation of loading the parity data and/or the intermediate parity data stored in the second memory 130 into the first memory 120.

In some example embodiments, based on an empty slot being in the plurality of slots of the first memory 120, the processor 110 may be configured to load the parity data and/or the intermediate parity data stored in the second memory 130 into the empty slot.

In some example embodiments, based on no empty slot being in the plurality of slots of the first memory 120, the processor 110 may be configured to transfer data in the one slot of the plurality of slots of the first memory 120 to the second memory 130, and to transfer the parity data and/or the intermediate parity data stored in the second memory 130 into the one slot. In some example embodiments, the processor 110 may be configured to initially store the parity data and/or the intermediate data in the second memory based on no empty slots being in the plurality of slots of the first memory 120.

In some example embodiments, the processor 110 may be configured to select one slot of the plurality of slots based on a least-recently-used (LRU) policy in the first memory 120. However, some other example embodiments within the scope of the present disclosure may not be limited thereto. For example, in some other example embodiments, the processor 110 may be configured to select the one slot based on a least-frequently-used (LFU) or adaptive replacement policy in the first memory 120.

In some example embodiments, the operations of FIGS. 6 to 8 may also be described from the viewpoint of the operation of the processor 110, such a processor 110.

In some example embodiments, based on the number of parity data and/or intermediate parity data to be stored in the first memory 120 being less than the calculated value, the processor 110 may be configured to store the parity data and/or the intermediate parity data in the first memory 120.

In some example embodiments, based on the number of parity data and/or intermediate parity data to be stored in the first memory 120 being equal to or greater than the value, the processor 110 may be configured to transfer the one data stored in the first memory 120 to the second memory 130, and to store the parity data and/or the intermediate parity data in the first memory 120.

In some example embodiments, based on, the number of parity data or intermediate parity data to be stored in the first memory 120 being less than the value, the processor 110 may be configured to transfer the parity data and/or the intermediate parity data stored in the second memory 130 into the first memory 120.

In some example embodiments, based on the number of parity data and/or intermediate parity data to be stored in the first memory 120 being equal to or greater than the value, the processor 110 may be configured to transfer the one data stored in the first memory 120 into the second memory 130, and to transfer the parity data and/or the intermediate parity data stored in the second memory 130 to the first memory 120.

Figure 9:
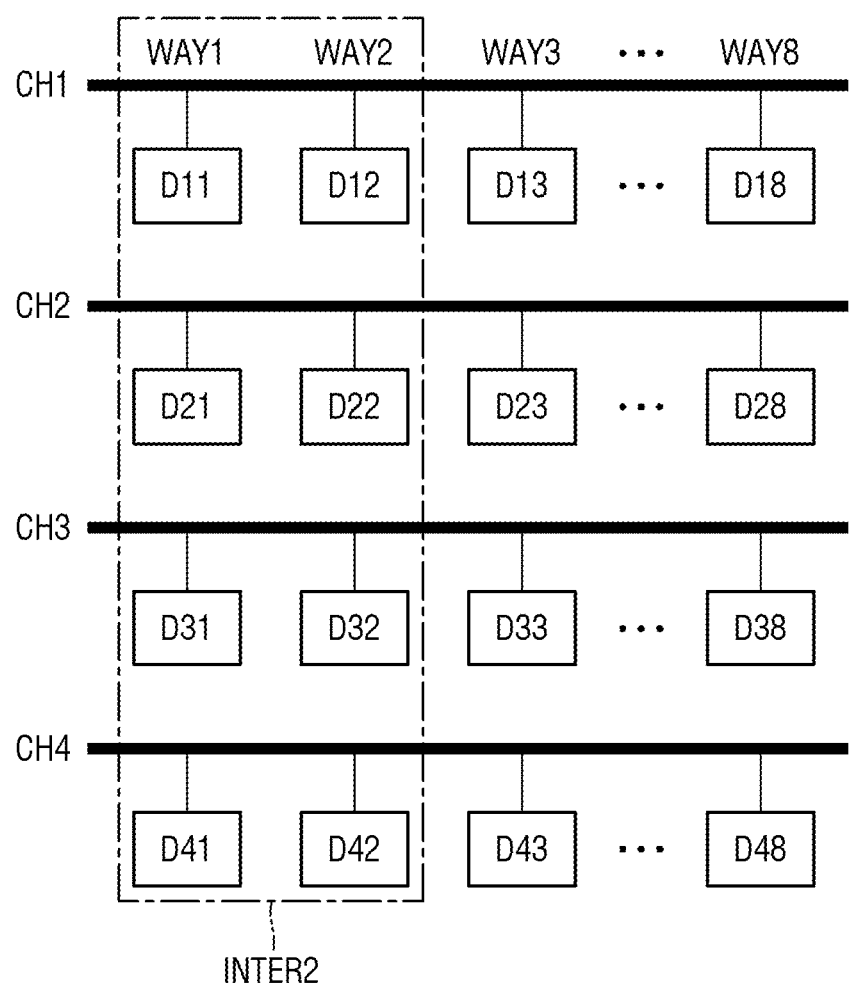
FIG. 9 is a block diagram illustrating a non-volatile memory of a storage device according to some example embodiments of the present disclosure.

FIG. 9 is a block diagram illustrating the non-volatile memory of the storage device according to some example embodiments of the present disclosure.

Referring to FIG. 9, an interleaving region INTER2 represents another execution unit of program buffering of the non-volatile memory 140. For example, in the example embodiment shown in FIG. 9, the interleaving region INTER2 includes four channels and two ways.

In the example embodiment shown in FIG. 9, the number of execution units of the program buffering may be 8 corresponding to the number of dies D11, D12, D21, D22, D31, D32, D41 and D42 connected to four channels and two ways. Thus, the first memory 120 may include, for example, (8−1=7) seven slots.

In some example embodiments of the present disclosure, the number of slots of the first memory 120 may be proportional to the number of execution units of program buffering of the non-volatile memory 140. In the example embodiment shown in FIG. 9, even if the number is not necessarily 3, it may be a number that is proportional to the number of execution units of the program buffering.

In some example embodiments of the present disclosure, the number of slots of the first memory 120 may be smaller than the number of multi-stream data.

Figure 10:
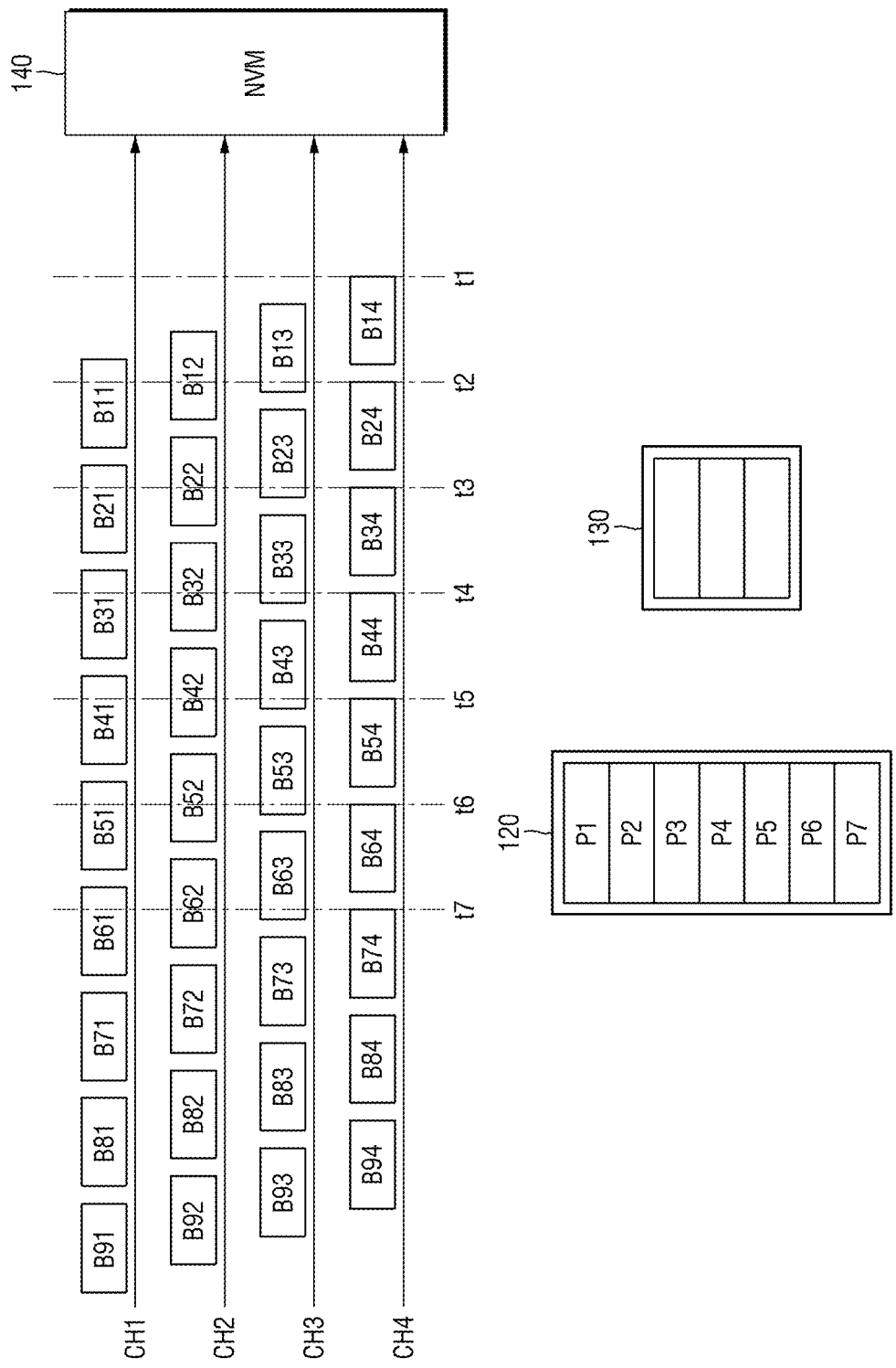
FIGS. 10 to 12 are block diagrams illustrating operation of a storage device according to some example embodiments of the present disclosure in relation to FIG. 9.
Figure 11:
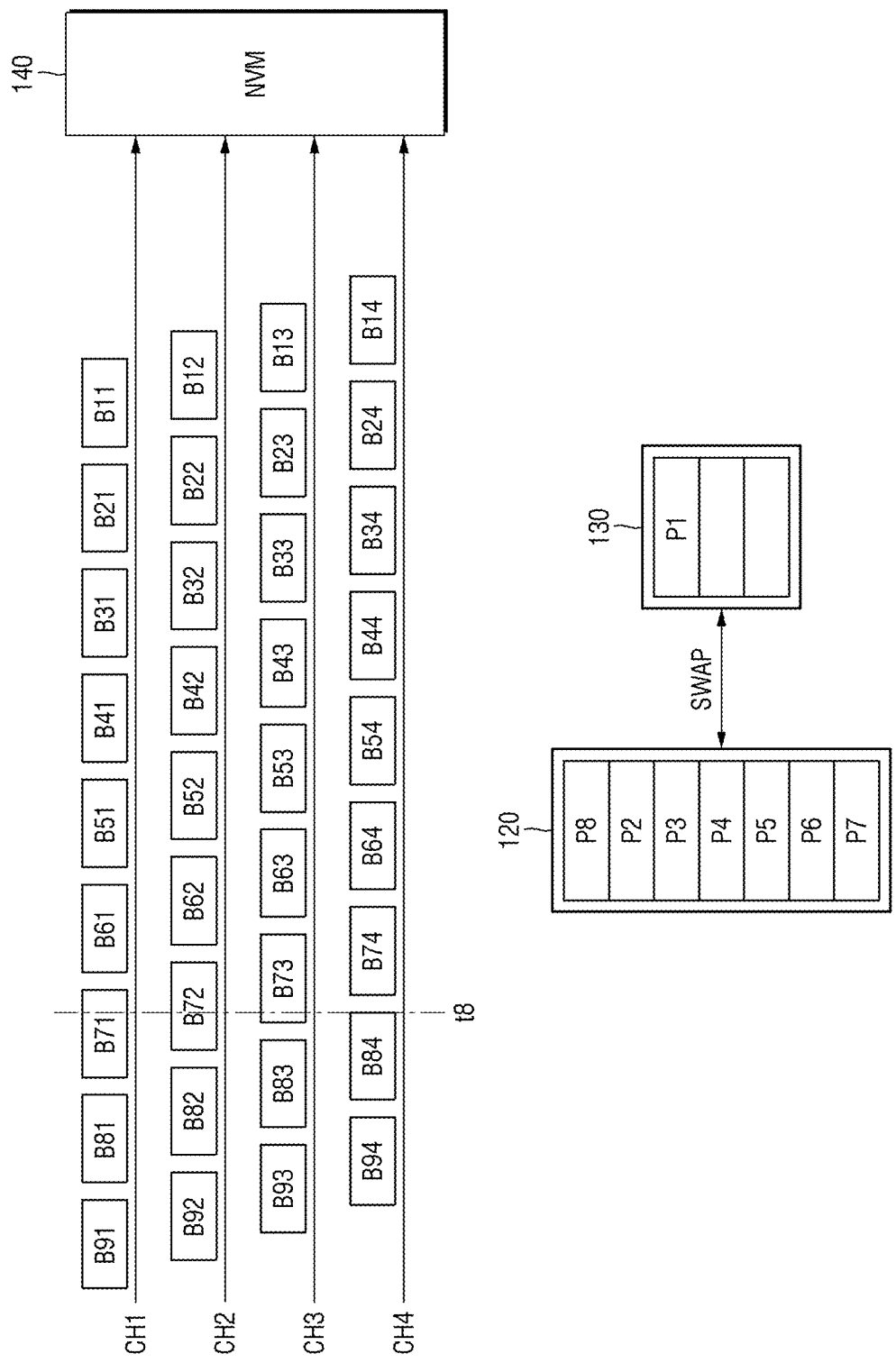
Figure 12:
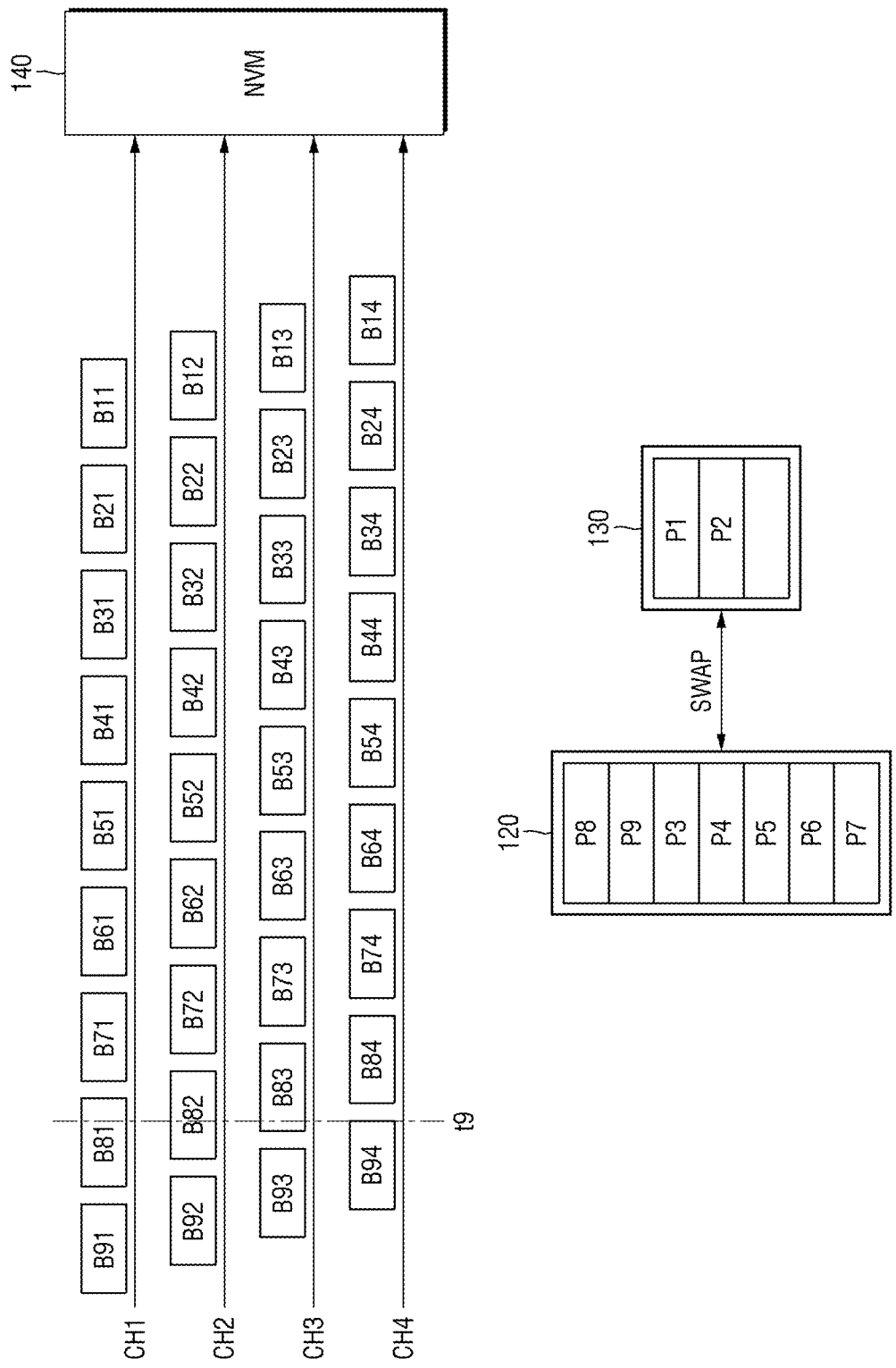

FIGS. 10 to 12 are block diagrams illustrating the operation of the storage device according to some example embodiments of the present disclosure in relation to FIG. 9.

First, referring to FIG. 10, based on an empty slot being in the plurality of slots in the first memory 120, the processor 110 may be configured to store the parity data and/or the intermediate parity data in the empty slot. In the example embodiment shown in FIG. 10, the number of slots of the plurality of slots in the first memory 120 are seven, based on the contents of FIG. 9.

At time t1, the processor 110 may be configured to store a data chunk B14 in the first memory 120. Further, the processor 110 may be configured to store the intermediate parity data in the first memory 120 based on the detection of the data chunks B13 and B12, and then, the processor 110 may be configured to store the final parity data as "P1" in the first memory 120 according to the detection of the data chunk B11. In this way, the final parity data "P2" to "P7" are stored in the empty slots.

Subsequently, referring to FIG. 11, based on no empty slot being in the plurality of slots in the first memory 120, the processor 110 may be configured to transfer the data stored in the one slot of the first memory 120 to the second memory 130, and to store the parity data and/or the intermediate parity data in the one slot.

At time t8, the data chunk B84 is to be stored in the first memory 120, but there is no empty slot in the plurality of slots of the first memory 120. In this case, the processor 110 may be configured to transfer the data "P1" stored in the one slot of the first memory 120 to the second memory 130, and to store the data chunk B84 in the one slot. Further, the processor 110 may be configured to store the intermediate parity data in the first memory 120 according to the detection of the data chunks B83 and B82, and then, the processor 110 may be configured to store the final parity data as "P8" in the first memory 120 according to the detection of the data chunk B81.

In the example embodiment of FIG. 11, the processor 110 may be configured to select the one slot of the plurality of slots in the first memory 120 based the LRU policy, but some other example embodiments within the scope of the present disclosure may not be limited thereto.

Next, referring to FIG. 12, at time t9, data chunk B94 is to be stored in the first memory 120, but there is no empty slot in the plurality of slots in the first memory 120. In this case, the processor 110 may be configured to transfer the data "P2" stored in the one slot of the first memory 120 to the second memory 130, and to store the data chunk B94 in the one slot. Also, the processor 110 may be configured to store the intermediate parity data in the first memory 120 according to the detection of the data chunks B93 and B92, and then, the processor 110 may be configured to store the final parity data as "P9" in the first memory 120 according to the detection of the data chunk B91.

In some example embodiments, the operations of FIGS. 10 to 12 may be equally or similarly applied to the case of the loading parity data and/or the intermediate parity data stored in the second memory 130 into the first memory 120.

In some example embodiments, in connection with FIGS. 5 and 9 described above, processor 110 may be further configured to change the number of slots in the plurality of slots of the first memory 120 based on a change of the number of execution units of program buffering. That is, based on the operation policy of the storage device 10 being changed and/or the interleaving region being changed, the storage device 10 may be configured to increase or decrease the number the plurality of slots designated in the first memory 120 to reflect the changes.

Figure 13:
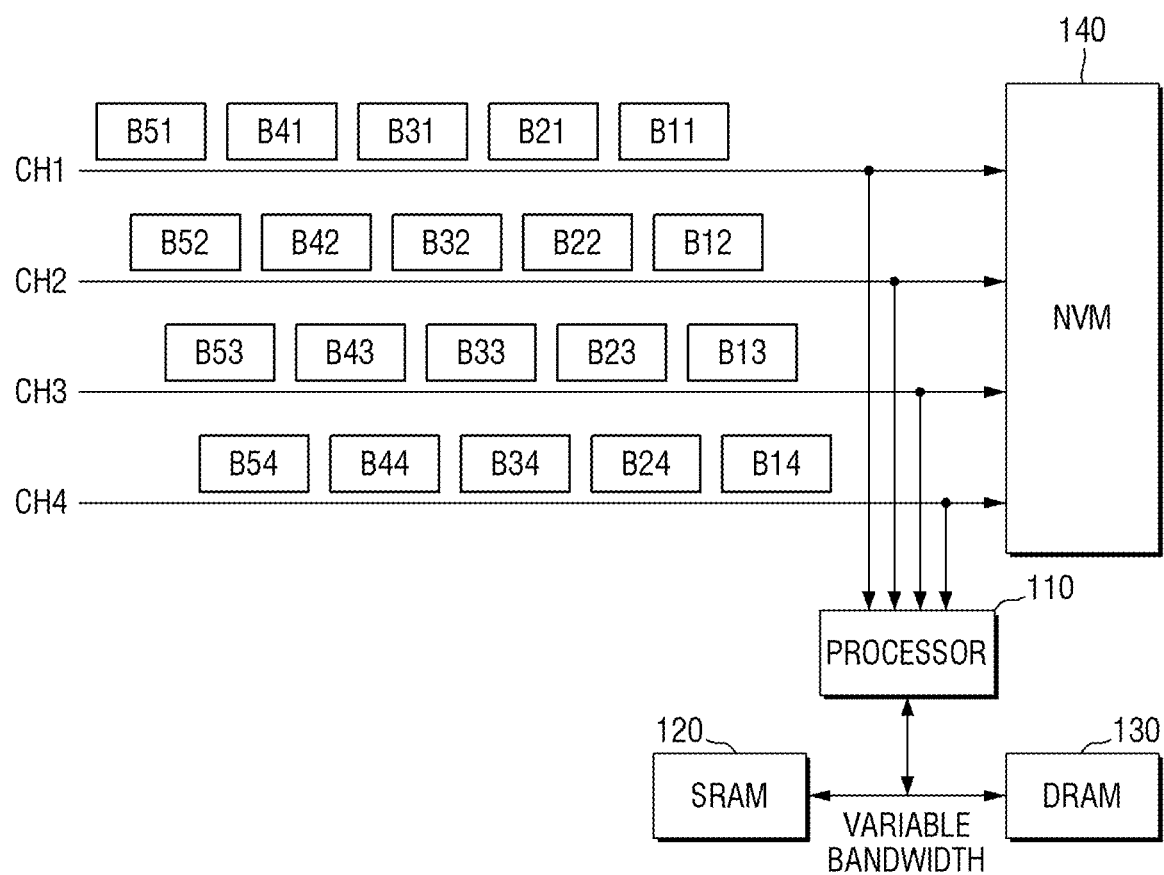
FIG. 13 is a block diagram illustrating a storage device according to some example embodiments of the present disclosure.

FIG. 13 is a block diagram illustrating a storage device according to an embodiment of the present disclosure.

Referring to FIG. 13, the storage device 10 according to some example embodiments of the present disclosure, processor 110 may be further configured to vary the bandwidth used to perform a data swap between the first memory 120 and the second memory 130. That is, when performing a load/store swap, the processor 110 may be configured to variably set the size thereof, for example, to save the bandwidth of the second memory 130 such as DRAM.

According to some example embodiments of the present disclosure, an advantageous effect may include enhancing the performance and/or the efficiency of processing the parity data in the storage device that supports multi-stream data to which a data storage technique using the parity data is applied.

Some example embodiments of the present disclosure may include, a method for operating the storage device 10 including receiving a first data stream of multi-stream data to generate parity data of the first data stream and/or intermediate parity data upon which the parity data is based; determining whether there is an empty slot in a plurality of slots of a first memory 120; storing the parity data and/or the intermediate parity data in an empty slot based on an empty slot being in the plurality of slots of the first memory 120; transferring the data stored in the one slot of the plurality of slots of the first memory 120 to a second memory 130 based on no empty slot being in the plurality of slots of the first memory 120, and storing the parity data and/or the intermediate parity data in one slot of the plurality of slots of the first memory 120, wherein a number of slots of the plurality of slots of the first memory 120 is based on a number of execution units of program buffering of the non-volatile memory 140.

In concluding the detailed description, those skilled in the art will appreciate that many variations and modifications may be made to some example embodiments without substantially departing from the principles of the present disclosure. Therefore, the disclosed example embodiments of the disclosure are used in a generic and descriptive sense only and not for purposes of limitation.

What is claimed is:

1. A storage device comprising:
    processing circuitry configured to,
        write multi-stream data on a non-volatile memory;
        generate parity data of the multi-stream data and/or intermediate parity data upon which the parity data is based;
        store the parity data and/or the intermediate parity data in a first memory; and
        perform a data swap between the first memory and a second memory in response to a plurality of slots in the first memory having no empty slot,
    wherein a number of slots of a plurality of slots in the first memory is determined according to a number of execution units of program buffering of the non-volatile memory,
    wherein the number of slots of the first memory is proportional to a number of execution units of the program buffering of the non-volatile memory, and
    wherein the number of execution units of the program buffering is based on a number of channels and ways of the non-volatile memory.

2. The storage device of claim 1, wherein the number of slots of the plurality of slots is smaller than a number of streams in the multi-stream data.

3. The storage device of claim 1, wherein the processing circuitry is further configured to, based on an empty slot being in the first memory,
    store the parity data and/or the intermediate parity data in the empty slot.

4. The storage device of claim 1, wherein, the processing circuitry is further configured to, based on no empty slot being in the first memory,
    transfer data stored in one slot of the first memory to the second memory, and
    store the parity data and/or the intermediate parity data in the one slot.

5. The storage device of claim 4, wherein the processing circuitry is further configured to select the one slot of the plurality of slots based on a least recently used (LRU) policy.

6. The storage device of claim 1, wherein the processing circuitry is further configured to, based on an empty slot being in the first memory,
    load the parity data and/or the intermediate parity data stored in the second memory into an empty slot of the plurality of slots.

7. The storage device of claim 1, wherein the processing circuitry is further configured to, based on no empty slot being in the first memory,
    transfer data stored in one slot of the first memory to the second memory, and
    load the parity data and/or the intermediate parity data from the second memory into the one slot of the first memory.

8. The storage device of claim 7, wherein the processing circuitry is further configured to select the one slot in the plurality of slots based on a least recently used (LRU) policy.

9. The storage device of claim 1, wherein the processing circuitry is further configured to change the number of slots in the first memory based on a change of the number of execution units of the program buffering.

10. The storage device of claim 1, wherein the processing circuitry is further configured to vary a bandwidth for performing the data swap between the first memory and the second memory.

11. A storage device comprising:
    a non-volatile memory;
    a controller configured to write multi-stream data on the non-volatile memory;
    a processor configured to generate parity data of the multi-stream data and/or intermediate parity data upon which the parity data is based;
    a first memory configured to store the parity data and/or the intermediate parity data; and
    a second memory configured to perform data swap with the first memory,
    wherein the processor is configured to determine whether to perform the data swap based on
        a number of the parity data and/or the intermediate parity data stored in the first memory, and
        a value determined according to a number of execution units of a program buffering of the non-volatile memory,
    wherein the value is proportional to the number of execution units of the program buffering of the non-volatile memory, and
    wherein the number of execution units of the program buffering is based on a number of channels and ways of the non-volatile memory.

12. The storage device of claim 11, wherein the value is smaller than a number of streams in the multi-stream data.

13. The storage device of claim 11, wherein the processor is configured to, when the number of the parity data and/or the intermediate parity data to be stored in the first memory is less than the value, store the parity data and/or the intermediate parity data in the first memory.

14. The storage device of claim 11, wherein the processor is further configured to, when the number of the parity data and/or the intermediate parity data to be stored in the first memory is equal to or greater than the value,
    transfer one data stored in the first memory to the second memory, and
    store the parity data and/or the intermediate parity data in the first memory.

15. The storage device of claim 11, wherein the processor is further configured to, when the number of the parity data and/or the intermediate parity data to be stored in the first memory is less than the value, transfer the parity data and/or the intermediate parity data from the second memory to the first memory.

16. The storage device of claim 11, wherein the processor is further configured to, when the number of the parity data and/or the intermediate parity data to be stored in the first memory is equal to or greater than the value, transfer one data stored in the first memory to the second memory, and load the parity data and/or the intermediate parity data from the second memory to the first memory.

* * * * *